United States Patent [19]

Hattori

[11] Patent Number: 5,706,006

[45] Date of Patent: Jan. 6, 1998

[54] OPERATIONAL AMPLIFIER INCORPORATING CURRENT MATRIX TYPE DIGITAL-TO-ANALOG CONVERTER

[75] Inventor: Shigeo Hattori, Kanagawa, Japan

[73] Assignee: NEC Corporation, Tokyo, Japan

[21] Appl. No.: 636,189

[22] Filed: Apr. 22, 1996

[30] Foreign Application Priority Data

Apr. 21, 1995 [JP] Japan ..................... 7-096463

[51] Int. Cl.⁶ .................................... H03M 1/66
[52] U.S. Cl. .................................... 341/144
[58] Field of Search ........................... 341/144, 162, 341/119, 135, 153; 323/315

[56] References Cited

U.S. PATENT DOCUMENTS 4,381,497 4/1983 Lillis et al. ................ 341/144
4,814,688 3/1989 Colles .

FOREIGN PATENT DOCUMENTS 2311025 12/1990 Japan .
2311026 12/1990 Japan .
2311027 12/1990 Japan .

*Primary Examiner*—Brian K. Young
*Attorney, Agent, or Firm*—Sughrue, Mion, Zinn, Macpeak & Seas, PLLC

[57] ABSTRACT

In a digital-to-analog converter including a plurality of constant current sources, a plurality of first current switch elements connected between the constant sources and a first output terminal, and a plurality of second current switch elements connected between the constant current sources and a second output terminal, a reference voltage of the constant current sources is generated by an operational amplifier. The operational amplifier is disabled in response to a current control signal to turn OFF all the constant current sources.

14 Claims, 9 Drawing Sheets

| D2 | D1 | D0 | IN7 | IN6 | IN5 | IN4 | IN3 | IN2 | IN1 |
|----|----|----|-----|-----|-----|-----|-----|-----|-----|
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

5,706,006

OPERATIONAL AMPLIFIER INCORPORATING CURRENT MATRIX TYPE DIGITAL-TO-ANALOG CONVERTER

BACKGROUND OF THE INVENTION

1. Field of the Invention

The present invention relates to a current matrix type digital-to-analog (D/A) converter.

2. Description of the Related Art

A current matrix type D/A converter has high speed characteristics and high precision characteristics. A typical current matrix type D/A converter includes a plurality of unit current cells, i.e., a plurality of current switches, each including a constant current source, a first current switching element connected between the constant current source and a first output terminal, and a second current switching element connected between the constant current source and a second output terminal. Therefore, even when an analog output is not required, a current always flows through each of the unit current cells, thus increasing the power dissipation.

In a first prior art current matrix type D/A converter a first switch is interposed between the first current switching element and the first output terminal, and a second switch is interposed between the second current switching element and the second output terminal. When an analog output is not required, the first and second switches are turned OFF by a current control signal to cut OFF current paths between a power supply terminal and the first and second output terminals (see: JP-A-2-311025). This will be explained later in detail.

In the first prior art current matrix type D/A converter, however, even when the first and second switches are turned OFF, the constant current sources are still in an ON state, so that leakage currents flow therethrough. Thus, the reduction of power dissipation is still low.

In a second prior art D/A converter, signals are supplied via first inputs of OR circuits to the first and second current switching elements, while a current control signal is supplied via second inputs of the OR circuits. When an analog output is not required, the current control signal is supplied via the OR circuits to all the first and second current switching elements to turn OFF the first and second current switching elements, thus cutting OFF the current paths between the power supply terminal and the first and second output terminals (see: JP-A-2-311027). This will also be explained later in detail.

Also, in the second prior art current matrix type D/A converter, even when the first and second switches are turned OFF, the constant current sources are still in an ON state, so that leakage currents flow therethrough. Thus, the reduction of power dissipation is still low. Also, the number of OR circuits is increased as the number of input bits is increased. Here, if the number of input bits is N, the number of OR circuits is $2(2^N-1)$. This is disadvantageous with respect to the integration.

In a third prior art D/A converter, switches are connected to the constant current switches. When an analog output is not required, all the switches are turned OFF by a current control signal to cut OFF current paths between the power supply terminal and the first and second output terminals (see: JP-A-2-311026). This will also be explained later in detail.

Also, in the third prior art current matrix type D/A converter, even when the switches are turned OFF, the constant current sources are still in an ON state, so that leakage currents flow therethrough. Thus, the reduction of power dissipation is still low. Also, the number of switches is increased as the number of input bits is increased. Here, if the number of input bits is N, the number of OR circuits is $2^N-1$. This is disadvantageous with respect to the integration.

SUMMARY OF THE INVENTION

It is an object of the present invention to provide a small size current matrix type D/A converter with a lower power consumption.

According to the present invention, in a D/A converter including a plurality of constant current sources, a plurality of first current switch elements connected between the constant current sources and a first output terminal, and a plurality of second current switch elements connected between the constant current sources and a second output terminal, a reference voltage of the constant current sources is generated by an operational amplifier. When an analog output is not required, the operational amplifier is disabled in response to a current control signal to turn OFF all the constant current sources.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art D/A converters will be explained with reference to FIGS. 1 through 5.

Figure 1:
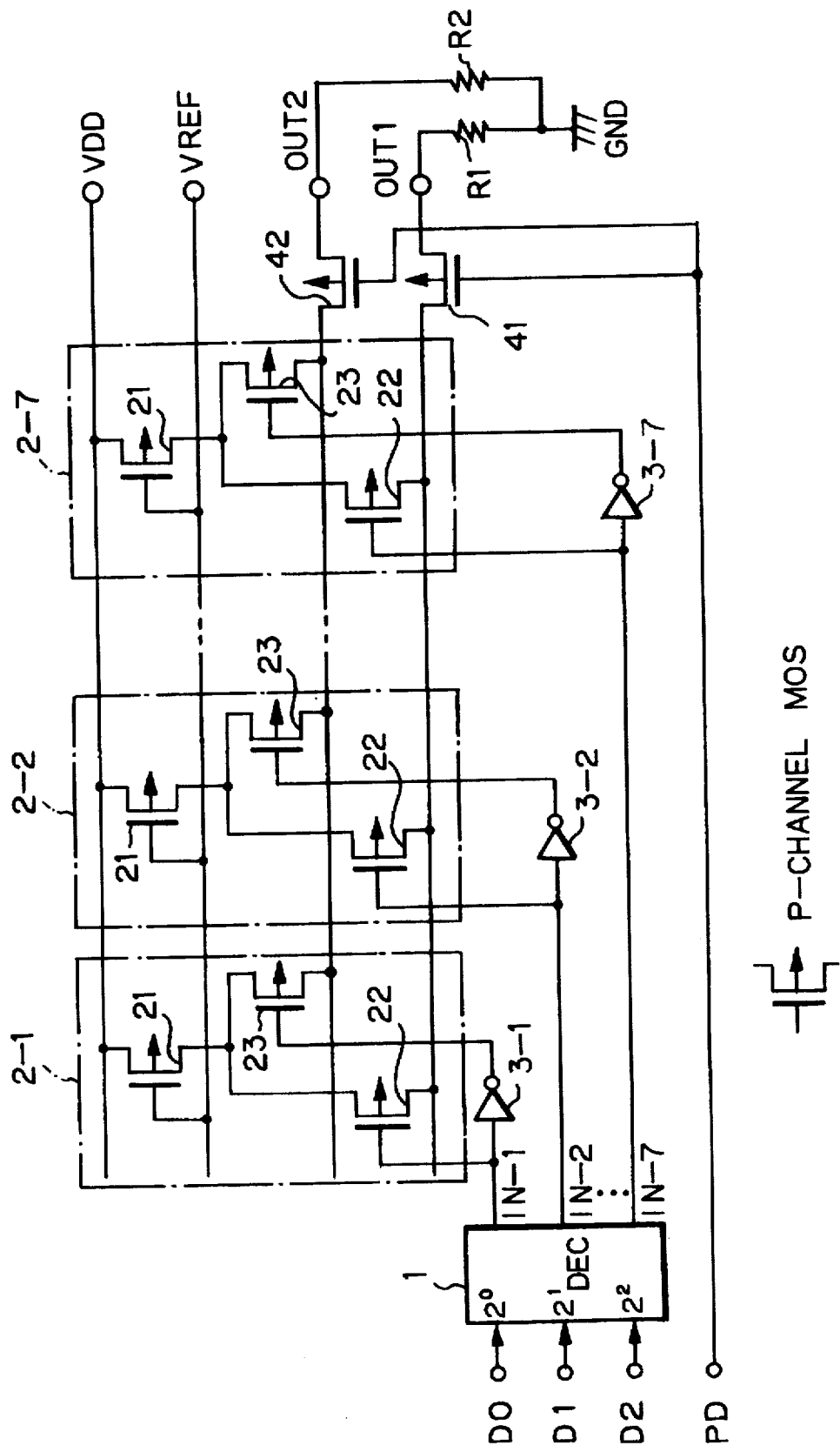
FIG. 1 is a circuit diagram illustrating a first prior art D/A converter.
Figures 2, 3:
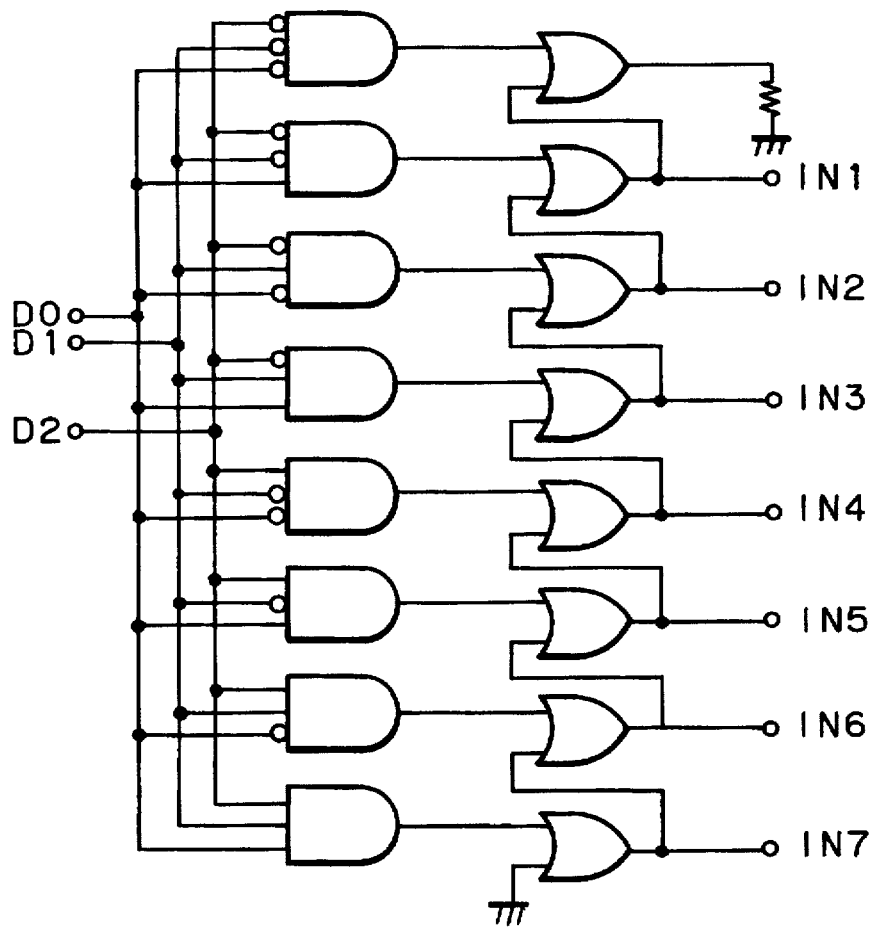
FIG. 2 is a logic circuit diagram of the decoder of FIG. 1.
FIG. 3 is a truth table showing the inputs and outputs of the decoder of FIG. 2.

In FIG. 1, which illustrates a first prior art D/A converter (see: JP-A-2-311025), three-bit binary data signals D0, D1 and D2 are supplied to a decoder 1, and the decoder 1 generates seven-bit input signals IN1, IN2, . . . , IN7. Seven unit constant current cell circuits 2-1, 2—2, . . . , 2-7 are provided for the input signals IN1, IN2, . . . , IN7, respectively. The detail of the decoder 1 is illustrated in FIG. 2, and a truth table showing relationships between the inputs and outputs of the decoder 1 is shown in FIG. 3.

Returning to FIG. 1, each of the unit constant current cell circuits 2-1, 2—2, . . . , 2-7 includes P-channel MOS transistors 21, 22 and 23. The source of transistor 21 is connected to a high power supply terminal VDD, and a reference voltage VREF is applied to the gate of the transistor 21. Thus, the transistor 21 serves as a constant current source. The sources of the transistors 22 and 23 are connected to the drain of the transistor 21, and the drains of the transistors 22 and 23 are connected to output terminals OUT1 and OUT2, respectively. Also, the gates of the transistors 22 and 23 are connected by the input signal such as IN1 and its inverted signal via an inverter sich as 3-1. Thus, the transistors 22 and 23 serve as current switching elements.

The output terminals OUT1 and OUT2 are connected to external loads R1 and R2, respectively, which are grounded.

Also, in FIG. 1, in order to reduce the power dissipation a P-channel MOS transistor 41 as a switch is interposed between the drains of the transistors 22 and the output terminal OUT1, and a P-channel MOS transistor 42 as a switch is interposed between the drains of the transistors 23 and the output terminal OUT2. When an analog output is not required at the output terminals OUT1 and OUT2, a current control signal PD is made high to turn OFF the transistors 41 and 42.

In the current matrix type D/A converter of FIG. 1, however, even when the transistors 41 and 42 are turned OFF, the transistors 21 are still in an ON state, so that leakage currents flow therethrough. Thus, the reduction of power dissipation is still low.

Figure 4:
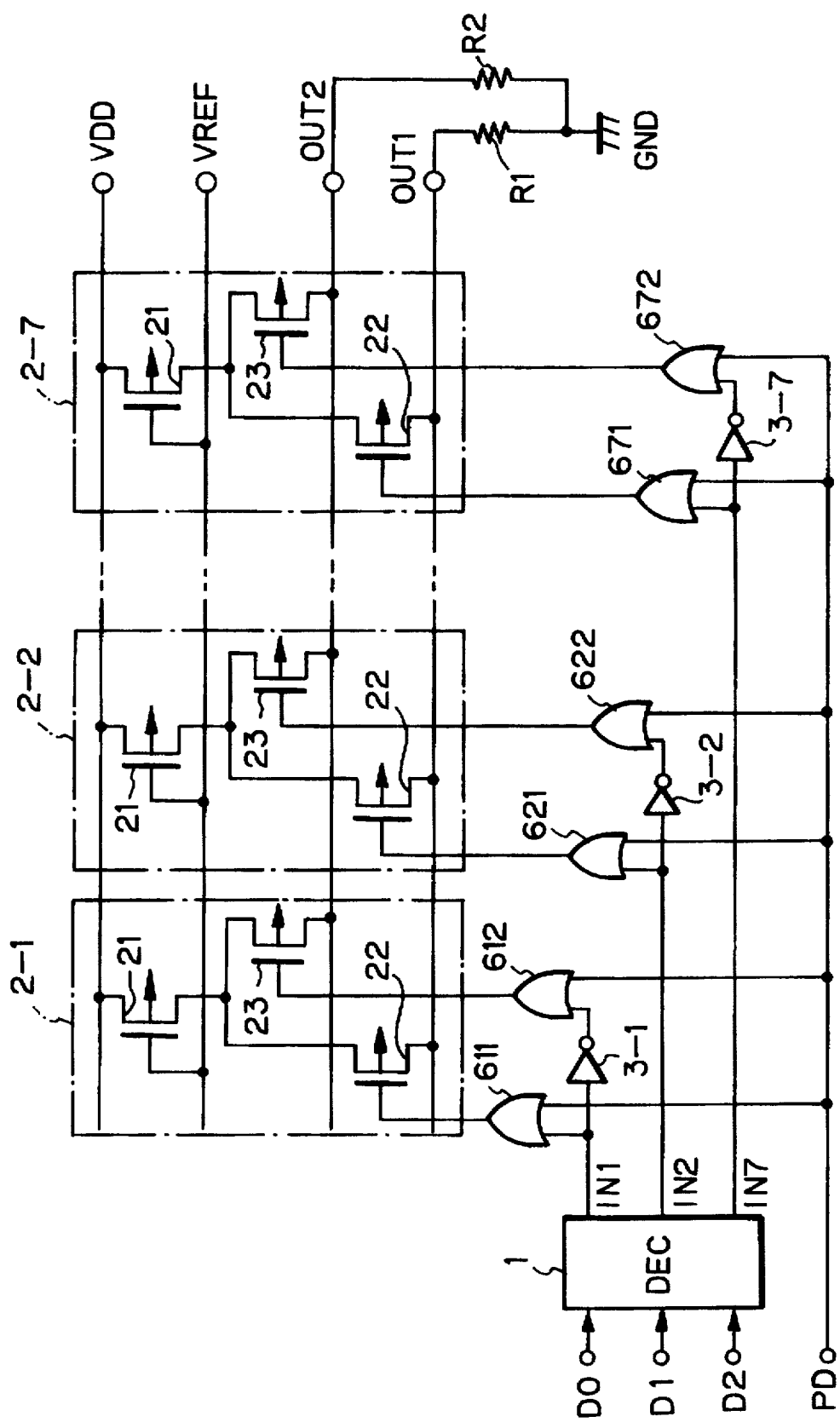
FIG. 4 is a circuit diagram illustrating a second prior art D/A converter.

In FIG. 4, which illustrates a second prior art D/A converter (see: JP-A-2-311027), OR circuits 611, 612, 621, 622, . . ., 671, 672 are provided instead of the transistors 41 and 42 of FIG. 1. When an analog output is not required at the output terminals OUT1 and OUT2, a current control signal PD is made high to turn OFF all the transistors 22 and 23.

Also, in the current matrix type D/A converter of FIG. 4, however, even when the transistors 22 and 23 are turned OFF, the transistors 21 are still in an ON state, so that leakage currents flow therethrough. Thus, the reduction of power dissipation is still low. Further, the number of OR circuits is increased as the number of input bits is increased. Here, the number of input bits is 3, so the number of OR circuits is $2(2^3-1)$ (=14). This is disadvantageous with respect to the integration.

Figure 5:
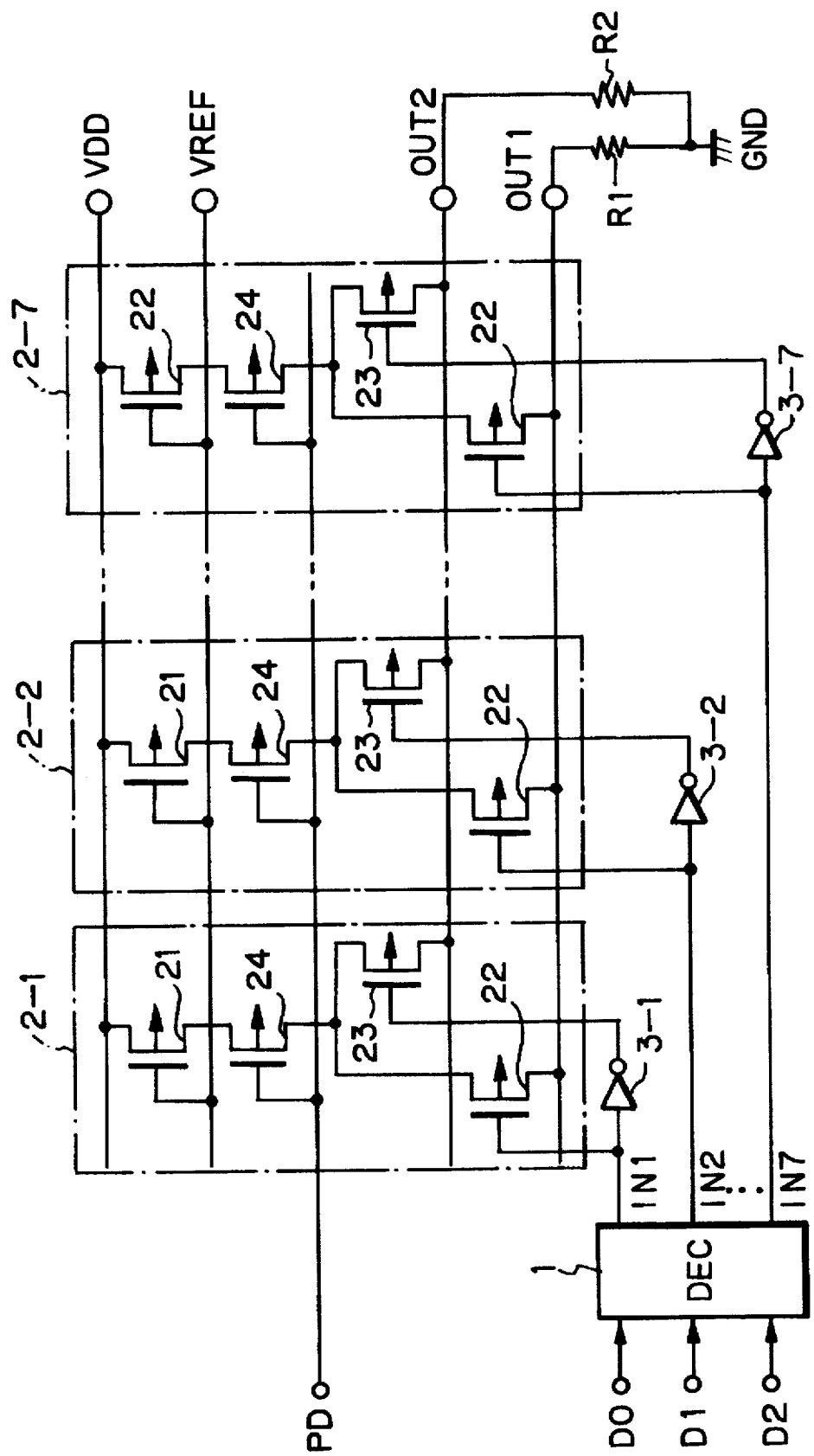
FIG. 5 is a circuit diagram illustrating a third prior art D/A converter.

In FIG. 5 which illustrates a third prior art D/A converter (see: JP-A-2-311026), a P-channel transistor 24 is added to each of the unit constant current cell circuits 2-1, 2—2, . . . , 2-7 of FIG. 1 instead of the transistors 41 and 42 of FIG. 1. When an analog output is not required at the output terminals OUT1 and OUT2, a current control signal PD is made high to turn OFF all the transistors 24.

Also, in the current matrix type D/A converter of FIG. 5, however, even when the transistors 24 are turned OFF, the transistors 21 are still in an ON state, so that leakage currents flow therethrough. Thus, the reduction of power dissipation is still low. Further, the number of transistors 24 is increased as the number of input bits is increased. Here, the number of input bits is 3, so the number of transistors 24 is $2^3-1$ (=7). This is disadvantageous with respect to the integration.

Figure 6:
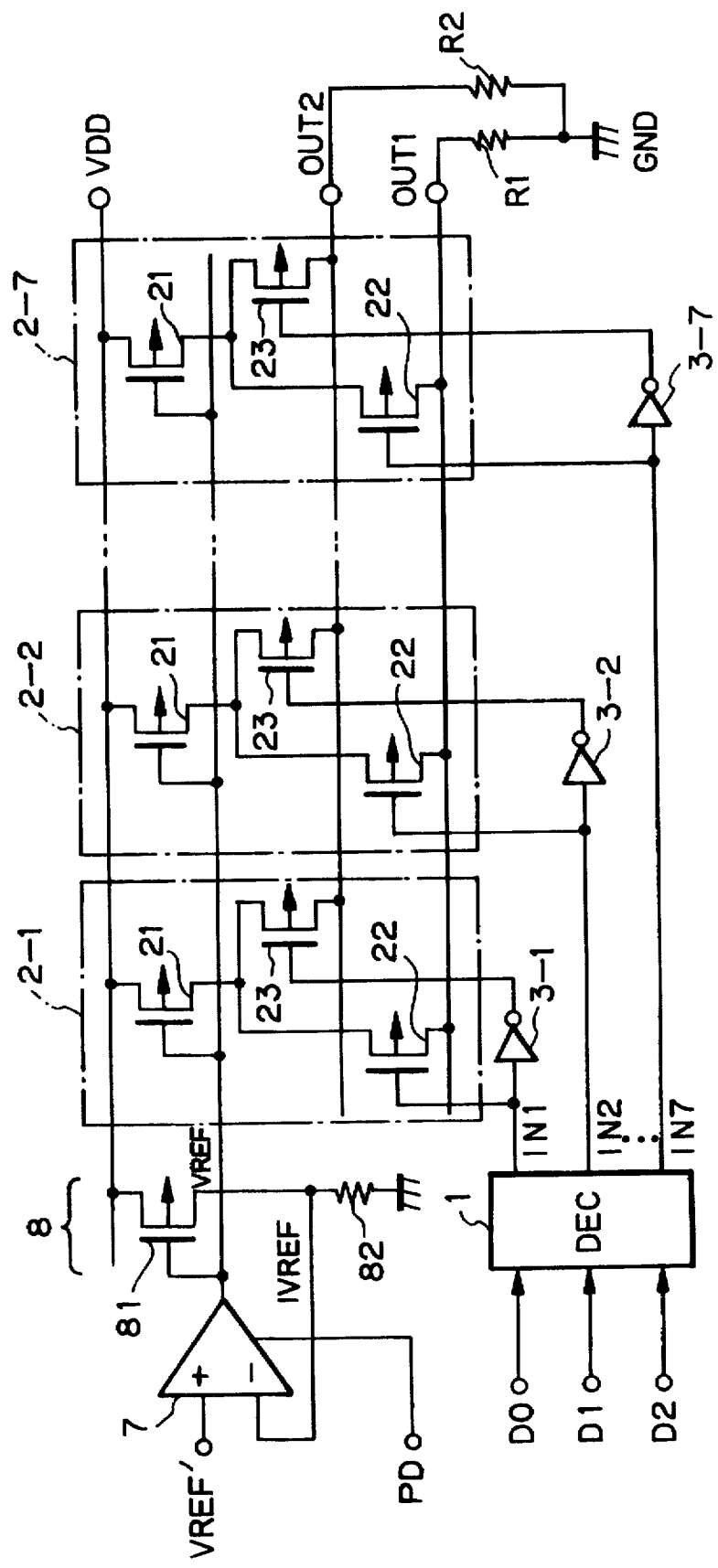
FIG. 6 is a circuit diagram illustrating a first embodiment of the D/A converter according to the present invention.

In FIG. 6, which illustrates a first embodiment of the present invention, an operational amplifier 7 and a feedback circuit 8 are provided for controlling the transistors 21, instead of the transistors 41 and 42 of FIG. 1. A reference voltage VREF is applied to an input (+) of the operational amplifier 7. Also, the feedback circuit 8 includes a P-channel MOS transistor 81 corresponding to the transistor 21 and a resistor 82. In this case, the reference voltage VREF is controlled so that a voltage IVREF of the resistor 82, which is applied to an input (−) of the operational amplifier 7, is brought close to the reference voltage VREF.

In FIG. 6, a current control signal PD is supplied to the operational amplifier 7. In this case, when the current control signal PD is made high, the operational amplifier 7 is disabled, so that the output voltage of the operational amplifier 7, i.e., the reference voltage VREF is made VDD. That is, VREF=VDD. As a result, all the transistors 21 as well as the transistor 81 are turned OFF.

The operational amplifier 7 of FIG. 6 is explained next in detail with reference to FIG. 7.

Figure 7:
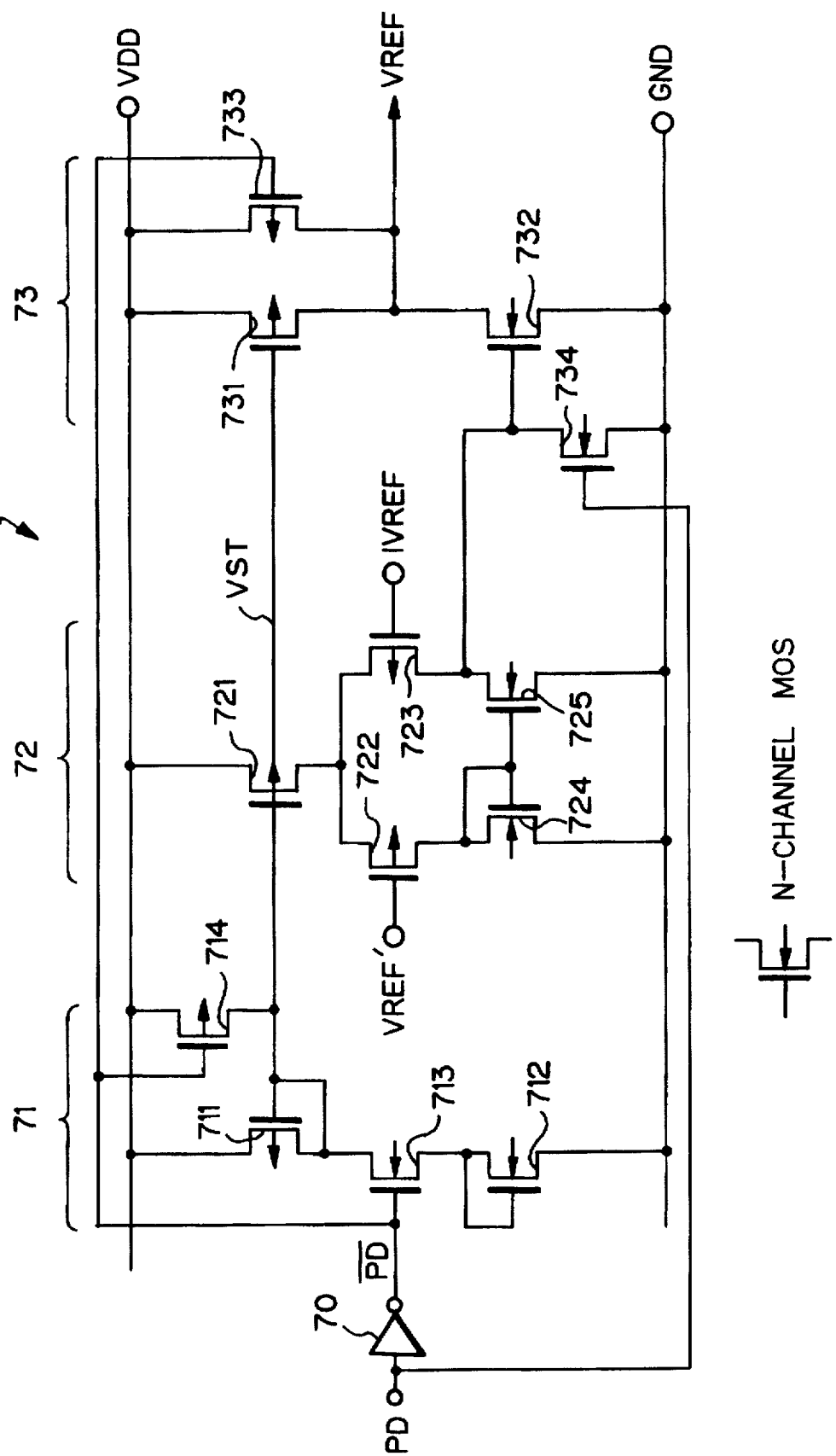
FIG. 7 is a circuit diagram illustrating a second embodiment of the D/A converter according to the present invention.

In FIG. 7, the current control signal PD and its inverted signal via an iverter 70 are supplied to the interior of the operational amplifier 7. The operational amplifier 7 is divided into a reference voltage generating circuit 71, a differential amplifier 72 and an output circuit 72.

The reference voltage generating circuit 71 includes a diode-connected P-channel MOS transistor 711 and a diode-connected N-channel MOS transistor 712 connected in series between the power supply terminal VDD and a ground terminal GND. In this reference voltage generating circuit 71, an N-channel MOS transistor 713 as a switch is interposed between the transistors 711 and 712, and a P-channel MOS transistor 714 as a switch is interposed between the power supply terminal VDD and the output of the reference voltage generating circuit 71. In this case, the transistors 713 and 714 are controlled by the inverted signal of the current control signal PD.

The differential amplifier circuit 72 includes a P-channel MOS transistor 721 forming a mirror circuit with the transistor 711 of the reference voltage generating circuit 71, P-channel MOS transistors 722 and 723 controlled by the reference voltage VREF and the voltage IVREF, and N-channel MOS transistors 724 and 725 forming a mirror circuit. Thus, the differential amplifier circuit 72 amplifies the difference between the reference voltage VREF and the voltage IVREF.

The output circuit 73 includes a P-channel MOS transistor 731 and an N-channel MOS transistor 732 connected in series between the power supply terminal VDD and a ground terminal GND. In this output circuit 73, an P-channel MOS transistor 733 as a switch is interposed between the power supply terminal VDD and the output of the output circuit 73, and an N-channel MOS transistor 734 as a switch is interposed between the gate of the transistor 732 and the power supply terminal VDD. In this case, the transistor 733 is controlled by the inverted signal of the current control signal PD, and the transistor 734 is controlled by the current control signal PD.

When the current control signal PD is lower than a threshold voltage of the inverter 70, the operational amplifier 7 of FIG. 7 is operated in a normal operation mode.

That is, in the reference voltage generating circuit 71, the transistors 713 and 714 are turned ON and OFF, respectively. Therefore, the reference voltage generates a reference voltage VST determined by the ON state transistors 711 and 712. As a result, the transistor 721 of the differential amplifier circuit 72 and the transistor 731 of the output circuit 73 forming the mirror circuits with the transistor 711 are in an ON state.

In the differential amplifier circuit 72, the transistor 721 serves as a constant current source, and therefore, the difference between the reference voltage VREF' and the voltage IVREF is amplified and is transmitted to the gate of the transistor 732 of the output circuit 73.

In the output circuit 73, the transistors 733 and 734 are turned OFF. Therefore, the output of the differential amplifier 72 is further amplified in the output circuit 73 to obtain the reference voltage VREF.

When the current control signal PD is higher than the threshold voltage of the inverter 70, the operational amplifier 7 of FIG. 7 is operated in a low power consumption operation mode.

That is, in the reference voltage generating circuit 71, the transistor 713 is turned OFF. Therefore, a current path between the power supply terminal VDD and the ground terminal GND in the reference voltage generating circuit 71 is cut OFF, to reduce the power dissipation. Also, the transistor 714 is turned ON, so that the reference voltage VST is pulled up to VDD. As a result, the transistor 721 of the differential amplifier circuit 72 and the transistor 731 of the output circuit 73 forming the mirror circuits with the transistor 711 are in an OFF state.

Therefore, the differential amplifier circuit 72 and the output circuit 73 are not operated to reduce the power dissipation.

Also, in the output circuit 73, the transistor 733 is turned ON to pull up the reference voltage VREF to VDD, thus avoiding a high impedance state of the reference voltage VRRF. Note that the high impedance state reference voltage VREF is unstable.

Further, in the output circuit 73, the transistor 734 is turned ON, to turn OFF the transistor 732. Thus, a leakage current flowing through the transistor 732 is surely cut OFF, which also reduces the power dissipation.

Returning to FIG. 6, in a normal operation mode, the transistors (constant current sources) 21 are turned ON. For example, if the input signals IN1, IN2, . . . , IN7 are low, all the transistors 22 are turned ON and all the transistors 23 are turned OFF, so that currents flowing through the transistors 21 are summed at the output terminal OUT1. Also, if the input signals IN1, IN2, . . . , IN7 are high, all the transistors 22 are turned OFF and all the transistors 23 are turned ON, so that currents flowing through the transistors 21 are summed at the output terminal OUT2.

On the other hand, in a low power consumption mode, the reference voltage VREF is pulled up to VDD by the operational amplifier 7. Therefore, all the transistors 21 are turned OFF. Therefore, no current flows between the power supply terminal VDD and the ground terminal in the unit current cell circuits 2-1, 2—2, . . . , 2-7. Also, no leakage currents flow through the transistors 21. As a result, the power dissipation is reduced.

Figure 8:
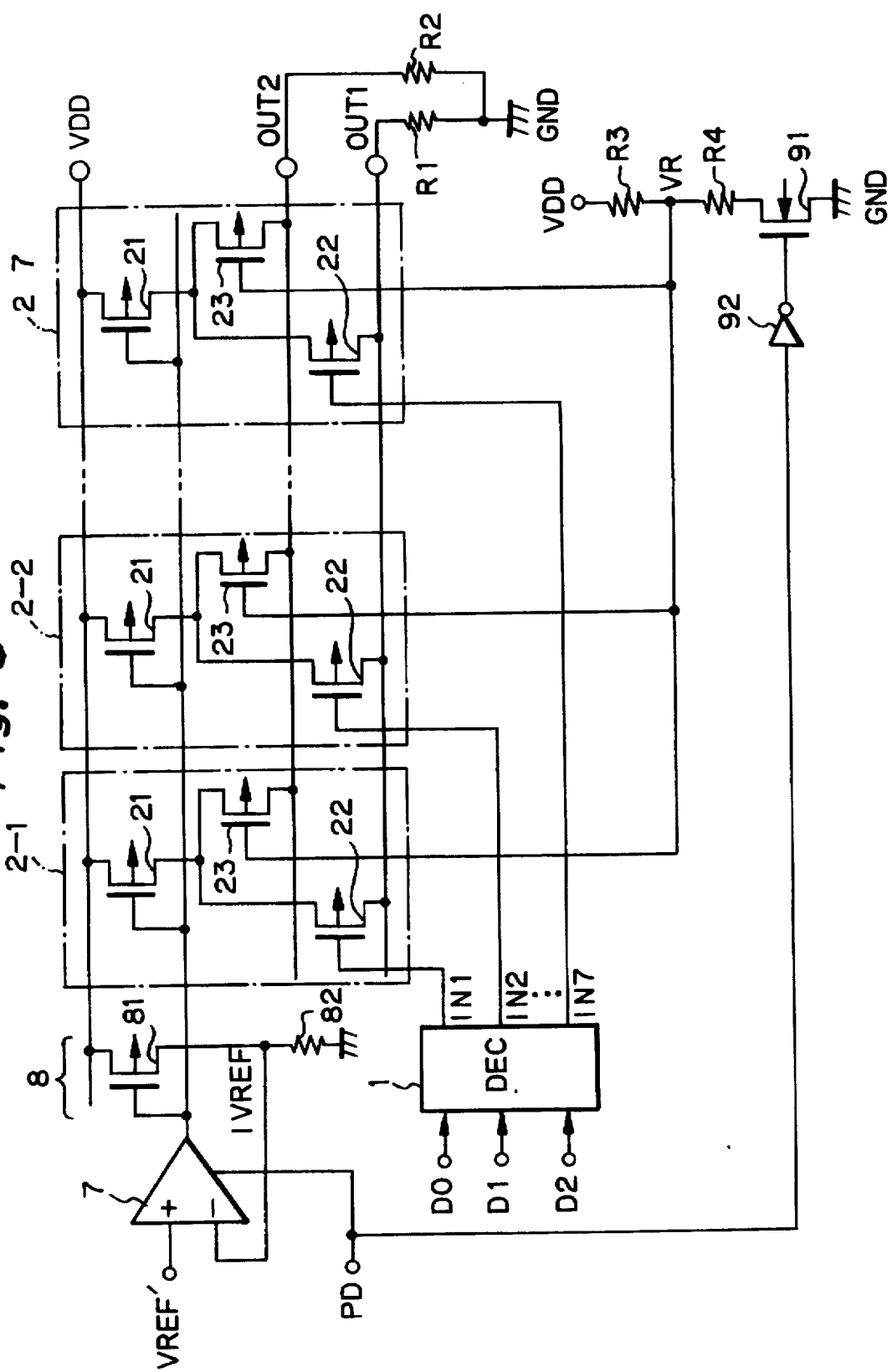
FIG. 8 is a circuit diagram illustrating a third embodiment of the D/A converter according to the present invention.

In FIG. 8, which illustrates a second embodiment of the present invention, a voltage divider formed by resistors R3 and R4 is provided instead of the inverters 3-1, 3-2, . . . , 3-7 of FIG. 6. In this case, a voltage VR determined by the voltage divider (R3, R4) is an intermediate level between a low level (GND) and a high level (VDD) of the input signals IN1, IN2, . . . , IN7. Therefore, in a normal operation mode, the D/A converter of FIG. 8 is operated in the same way as in the D/A converter of FIG. 6. In this case, since the voltage at the gates of the transistors 23 is constant, the noise characteristics are improved a compared with the D/A converter of FIG. 6.

Note that the number of inverters 3-1, 3-2, . . . , 3-7 of FIG. 6 is increased as the number of input bits is increased.

However, the number of the voltage divider of FIG. 8 is 1 even when the number of input bits is increased. Thus, the D/A converter of FIG. 8 is advantageous with respect to the integration as compared with the D/A converter of FIG. 6. Also, in FIG. 8, an N-channel MOS transistor 91 and an inverter 92 are provided to control the voltage divider (R3, R4). Therefore, in a normal operation mode (PD="0"), the transistor 91 is turned ON to activate the voltage divider (R3, R4). Contrary to this, in a low power consumption mode (PD="1"), the transistor 91 is turned OFF to deactivate the voltage divider (R3, R4), thus reducing the power dissipation.

Figure 9:
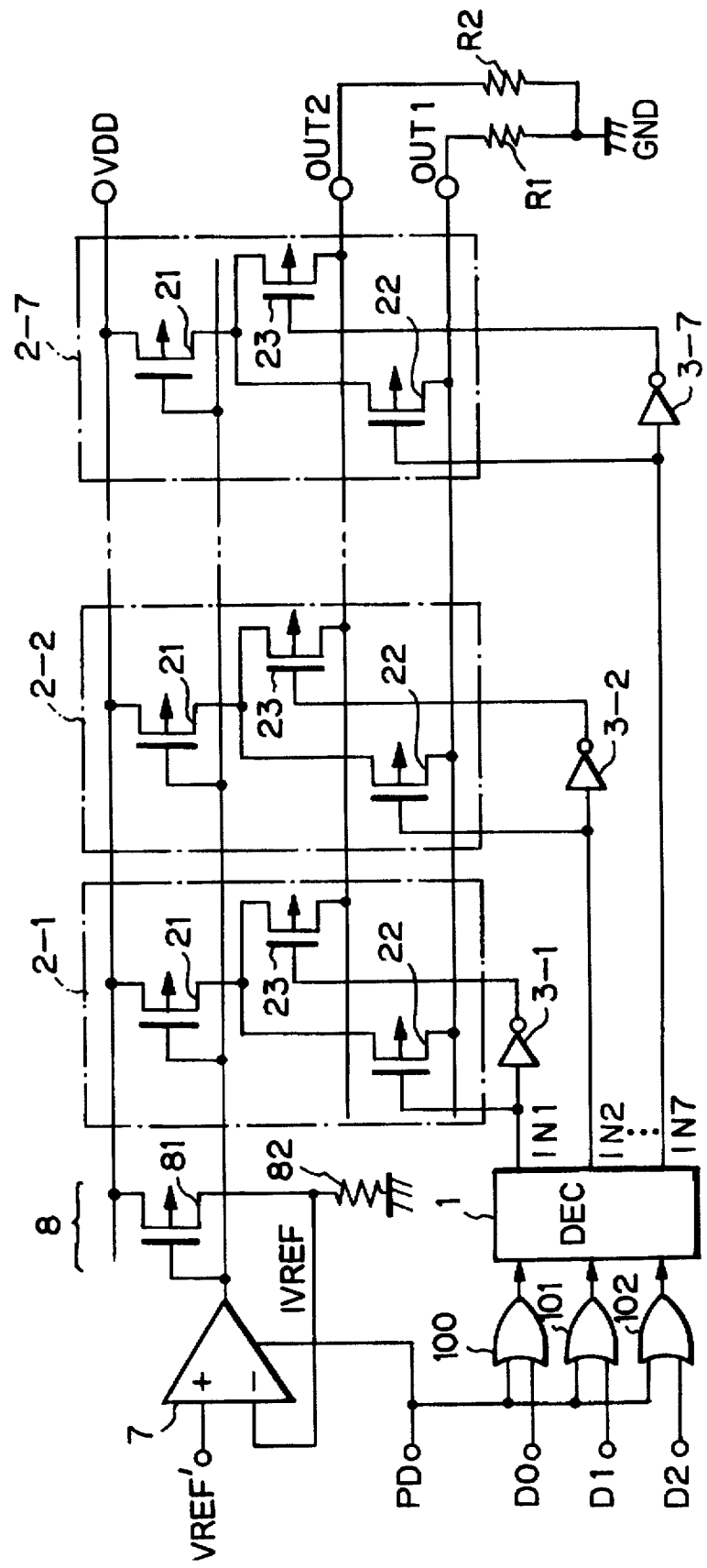
FIG. 9 is a circuit diagram illustrating a fourth embodiment of the D/A converter according to the present invention.

In FIG. 9, which illustrates a third embodiment of the present invention, OR circuits 100, 101 and 102 are added to the elements of FIG. 6. The OR circuits 100, 101 and 102 are controlled by the current control signal PD. For example, in a normal operation mode (PD="0"), the binary data signals D0, D1 and D2 pass through the OR circuits 100, 101 and 102 to the decoder 1. Contrary to this, in a low power consumption mode (PD="1"), all the outputs of the OR circuits 100, 101 and 102 are made "1" regardless of the binary data signals D0, D1 and D2. In other words, all the inputs of the decoder 1 are fixed at "1". Therefore, the state of the decoder 1 is fixed, thus reducing the power dissipation.

Figure 10:
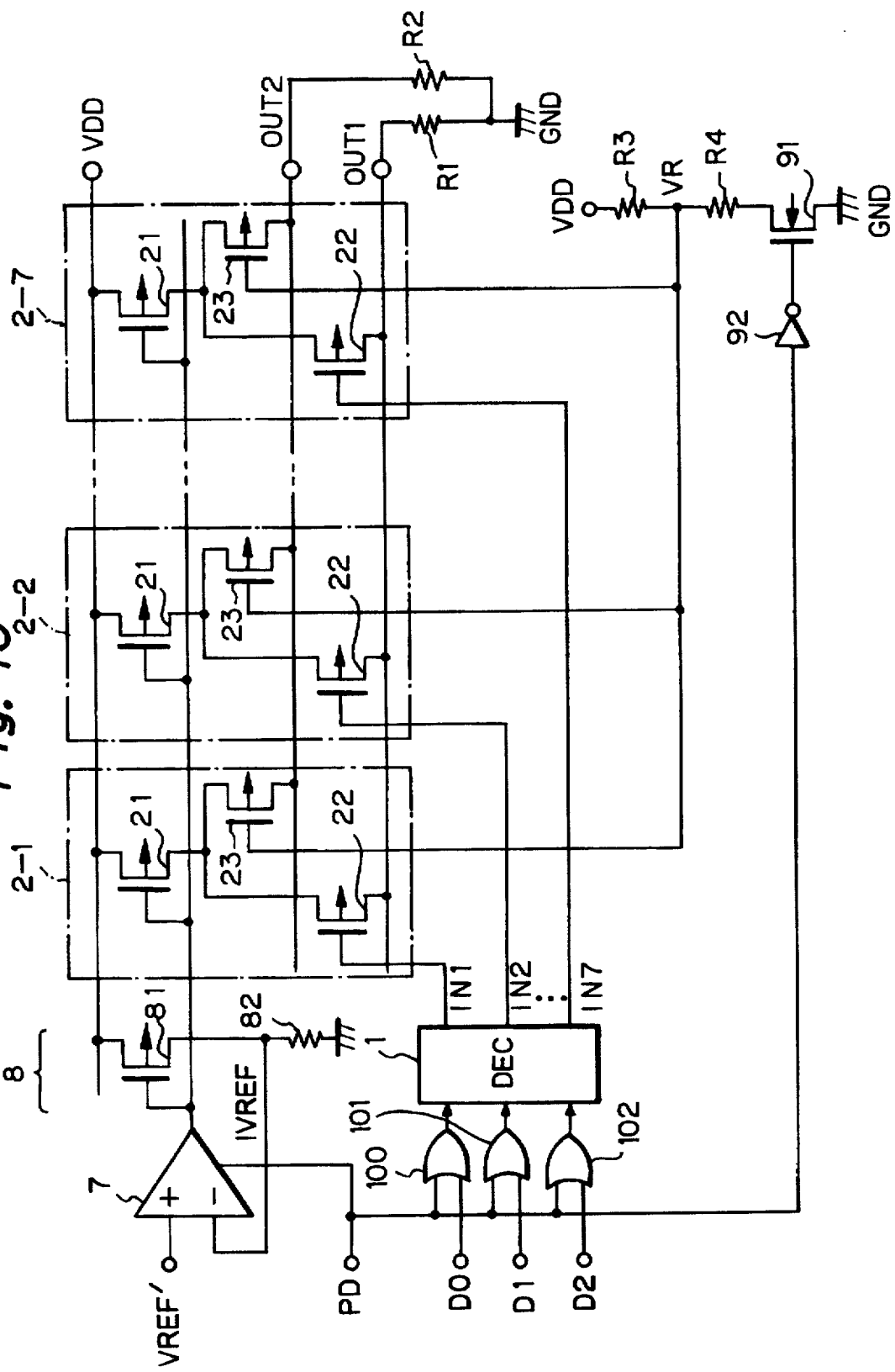
FIG. 10 is a circuit diagram illustrating a fifth embodiment of the D/A converter according to the present invention.

In FIG. 10, which illustrates a fourth embodiment of the present invention, the D/A converter of FIG. 8 is combined with the D/A converter of FIG. 9. Thus, the power dissipation is further reduced.

In the above-mentioned embodiments, the polarities of the voltages of the power supply terminal VDD and the ground terminal GND can be reversed, and accordingly, the conductivity types of the transistors can be reversed.

As explained hereinbefore, according to the present invention, since the constant current sources per se are turned OFF by the operational amplifier in a low power consumption mode, the power dissipation can be further reduced as compared with the prior art. Also, even if the number of input bits is increased, additional circuits for reducing the power dissipation are unnecessary, thus enhancing the integration.

I claim:

1. A digital-to-analog converter comprising:
   first and second power supply terminals;
   first and second output terminals;
   a plurality of constant current sources connected to said first power supply terminal;
   a plurality of first current switching elements, each connected between one of said constant current sources and said first output terminal;
   a plurality of second current switching elements, each connected between one of said constant current sources and said second output terminal;
   means for supplying a plurality of first signals to said first current switching elements;
   means for supplying a plurality of second signals to said second current switching elements;
   an operational amplifier for generating a first reference voltage and applying it to said constant current sources;
   means for providing a second reference voltage to a first input of said operational amplifier;
   feedback means for providing a feedback voltage of an output of said operational amplifier to a second input of said operational amplifier; and
   means for disabling said operational amplifier in response to a current control signal to turn OFF all said constant current sources.

2. The digital-to-analog converter as set forth in claim 1, wherein said operational amplifier comprises:

a reference voltage generating circuit, connected between said first and second power supply terminals, for generating an output voltage between voltages at said first and second power supply terminals, said reference voltage generating circuit including a first switch for cutting OFF a current path within said reference voltage generating circuit in response to said current control signal and a second switch connected between said first power supply terminal and an output of said reference voltage generating circuit and operated in response to said current control signal;

a differential amplifier circuit, connected between said first and second power supply terminals, for amplifying a difference between said reference voltage and the feedback voltage of said feedback means to generate an output voltage, said differential amplifier circuit being operated in response to the output voltage of said reference voltage generating circuit; and an output circuit, connected between said first and second power supply terminals, for amplifying the output voltage of said differential amplifier circuit in response to the output voltage of said differential amplifier circuit, to generate said first reference voltage.

3. The digital-to-analog converter as set forth in claim 2, wherein said output circuit includes a third switch connected between said first power supply terminal and an output of said output circuit, said third switch being operated in response to said current control signal.

4. The D/A converter as set forth in claim 1, wherein said operational amplifier comprises a reference voltage generating circuit, a differential amplifier circuit and an output circuit, said reference voltage generating circuit comprising:

a first transistor of a first conductivity type having a source connected to said first power supply terminal and a gate connected to a drain of said first transistor;

a second transistor of a second conductivity type opposite to said first conductivity type having a source connected to said second power supply terminal and a gate connected to a drain of said second transistor;

a third transistor of said second conductivity type connected between the drains of said first and second transistors, said third transistor having a gate controlled by an inverted signal of said current control signal; and a fourth transistor of said first conductivity type connected between said first power supply terminal and the drain of said first transistor, a gate of said fourth transistor being controlled by the inverted signal of said current control signal, said differential amplifier circuit comprising:

a fifth transistor of said first conductivity type having a source connected to said first power supply terminal, a gate connected to the drain of said first transistor and a drain;

a sixth transistor of said first conductivity type having a source connected to the drain of said fifth transistor, a gate for receiving said second reference voltage, and a drain;

a seventh transistor of said first conductivity type having a source connected to the drain of said fifth transistor, a gate for receiving said second feedback voltage, and a drain;

an eighth transistor of said second conductivity type having a source connected to said second power supply terminal, a drain connected to the drain of said sixth transistor, and a gate connected to the drain of said eighth transistor; and a ninth transistor of said second conductivity type having a source connected to said second power supply terminal, a drain connected to the drain of said seventh transistor, and a gate connected to the drain of said eighth transistor, said output circuit comprising:

a tenth transistor of said first conductivity type having a source connected to said first power supply terminal, a gate connected to the drain of said first transistor and a drain for generating said first reference voltage;

an eleventh transistor of said second conductivity type having a source connected to said second power supply terminal, a gate connected to the drain of said ninth transistor, and a drain connected to the drain of said tenth transistor;

a twelfth transistor of said first conductivity type connected between said first power supply terminal and the drain of said tenth transistor, a gate of said twelfth transistor being controlled by the inverted signal of said current control signal; and a thirteenth transistor connected between said second power supply terminal and the gate of said eleventh transistor, a gate of said thirteenth transistor being controlled by said current control signal.

5. The digital-to-analog converter as set forth in claim 1, wherein said first and second signal supplying means comprise a decoder for decoding binary data signals.

6. The digital-to-analog converter as set forth in claim 5, wherein said first and second signal supplying means further comprise OR circuits connected to inputs of said decoder, each of said OR circuits receiving one of said binary data signals and said current control signal.

7. The digital-to-analog converter as set forth in claim 1, wherein each of said constant current sources comprises a transistor of a first conductivity type, and each of said first and second current switching elements comprises a transistor of said second conductivity type.

8. A digital-to-analog converter comprising:

first and second power supply terminals;

first and second output terminals;

a plurality of constant current sources connected to said first power supply terminal;

a plurality of first current switching elements, each connected between one of said constant current sources and said first output terminal;

a plurality of second current switching elements, each connected between one of said constant current sources and said second output terminal;

means for supplying a plurality of input signals to said first current switching elements;

means for supplying a plurality of second signals to said second current switching elements;

a voltage divider, connected between said first and second power supply terminals, for supplying a definite voltage to said second current switching elements;

a switching means, included in said voltage divider, for cutting OFF a current path between said first and second power supply terminals within said voltage divider in response to a current control signal;

an operational amplifier for generating a first reference voltage and applying it to said constant current sources;

means for providing a second reference voltage to a first input of said operational amplifier;

feedback means for providing a feedback voltage of an output of said operational amplifier to a second input of said operational amplifier; and means for disabling said operational amplifier in response to said current control signal to turn OFF all said constant current sources.

9. The digital-to-analog converter as set forth in claim 8, wherein said operational amplifier comprises:

a reference voltage generating circuit, connected between said first and second power supply terminals, for generating an output voltage between voltages at said first and second power supply terminals, said reference voltage generating circuit including a first switch for cutting OFF a current path within said reference voltage generating circuit in response to said current control signal and a second switch connected between said first power supply terminal and an output of said reference voltage generating circuit and operated in response to said current control signal;

a differential amplifier circuit, connected between said first and second power supply terminals, for amplifying a difference between said reference voltage and the feedback voltage of said feedback means to generate an output voltage, said differential amplifier circuit being operated in response to the output voltage of said reference voltage generating circuit; and an output circuit, connected between said first and second power supply terminals, for amplifying the output voltage of said differential amplifier circuit in response to the output voltage of said differential amplifier circuit, to generate said first reference voltage.

10. The digital-to-analog converter as set forth in claim 9, wherein said output circuit includes a third switch connected between said first power supply terminal and an output of said output circuit, said third switch being operated in response to said current control signal.

11. The D/A converter as set forth in claim 8, wherein said operational amplifier comprises a reference voltage generating circuit, a differential amplifier circuit and an output circuit, said reference voltage generating circuit comprising:

a first transistor of a first conductivity type having a source connected to said first power supply terminal and a gate connected to a drain of said first transistor;

a second transistor of a second conductivity type opposite to said first conductivity type having a source connected to said second power supply terminal and a gate connected to a drain of said second transistor;

a third transistor of said second conductivity type connected between the drains of said first and second transistors, said third transistor having a gate controlled by an inverted signal of said current control signal; and a fourth transistor of said first conductivity type connected between said first power supply terminal and the drain of said first transistor, a gate of said fourth transistor being controlled by the inverted signal of said current control signal, said differential amplifier circuit comprising:

a fifth transistor of said first conductivity type having a source connected to said first power supply terminal, a gate connected to the drain of said first transistor and a drain;

a sixth transistor of said first conductivity type having a source connected to the drain of said fifth transistor, a gate for receiving said second reference voltage, and a drain;

a seventh transistor of said first conductivity type having a source connected to the drain of said fifth transistor, a gate for receiving said second feedback voltage, and a drain;

an eighth transistor of said second conductivity type having a source connected to said second power supply terminal, a drain connected to the drain of said sixth transistor, and a gate connected to the drain of said eighth transistor; and a ninth transistor of said second conductivity type having a source connected to said second power supply terminal, a drain connected to the drain of said seventh transistor, and a gate connected to the drain of said eighth transistor, said output circuit comprising:

a tenth transistor of said first conductivity type having a source connected to said first power supply terminal, a gate connected to the drain of said first transistor and a drain for generating said first reference voltage;

an eleventh transistor of said second conductivity type having a source connected to said second power supply terminal, a gate connected to the drain of said ninth, and a drain connected to the drain of said tenth transistor;

a twelfth transistor of said first conductivity type connected between said first power supply terminal and the drain of said tenth transistor, a gate of said twelfth transistor being controlled by the inverted signal of said current control signal; and a thirteenth transistor connected between said second power supply terminal and the gate of said eleventh transistor, a gate of said thirteenth transistor being controlled by said current control signal.

12. The digital-to-analog converter as set forth in claim 8, wherein said first signal supplying means comprises a decoder for decoding binary data signals.

13. The digital-to-analog converter as set forth in claim 12, wherein said signal supplying means further comprises OR circuits connected to inputs of said decoder, each of said OR circuits receiving one of said binary data signals and said current control signal.

14. The digital-to-analog converter as set forth in claim 8, wherein each of said constant current sources comprises a transistor of a first conductivity type, and each of said first and second current switching elements comprises a transistor of said second conductivity type.

* * * * *